(12) United States Patent
Kim et al.

(10) Patent No.: US 9,869,711 B2
(45) Date of Patent: Jan. 16, 2018

(54) METHOD FOR EVALUATING PERFORMANCE OF PLASMA WAVE TRANSISTOR

(71) Applicant: UNIST (ULSAN NATIONAL INSTITUTE OF SCIENCE AND TECHNOLOGY), Ulsan (KR)

(72) Inventors: Kyung Rok Kim, Ulsan (KR); Jong Yul Park, Seoul (KR); Sung-Ho Kim, Daejeon (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 15/120,786

(22) PCT Filed: May 7, 2014

(86) PCT No.: PCT/KR2014/004009
§ 371 (c)(1),
(2) Date: Aug. 23, 2016

(87) PCT Pub. No.: WO2015/126005
PCT Pub. Date: Aug. 27, 2015

(65) Prior Publication Data
US 2017/0010317 A1 Jan. 12, 2017

(30) Foreign Application Priority Data
Feb. 24, 2014 (KR) .................. 10-2014-0021365

(51) Int. Cl.
*G01R 31/26* (2014.01)

(52) U.S. Cl.
CPC .................. *G01R 31/2621* (2013.01)

(58) Field of Classification Search
CPC ..................... G01R 31/2621; G01R 31/26
(Continued)

(56) References Cited

U.S. PATENT DOCUMENTS

| 8,053,271 B2 | 11/2011 | Shur et al. |
| 2011/0001173 A1* | 1/2011 | Ojefors ............... H01L 23/66 257/290 |
| 2013/0277716 A1 | 10/2013 | Otsuji et al. |

FOREIGN PATENT DOCUMENTS

| JP | 2000058817 A | 2/2000 |
| JP | 2005142304 A | 6/2005 |

(Continued)

OTHER PUBLICATIONS

Krishna, et al., Terahertz Emitters, Detectors and Sensors: Current Status and Future Prospects, Photodetectors, Dr. Sanka Gateva (Ed.), pp. 115-144, Mar. 23, 2012.

(Continued)

*Primary Examiner* — Christopher Mahoney
(74) *Attorney, Agent, or Firm* — Hodgson Russ LLP

(57) ABSTRACT

A method for evaluating the performance of a plasma transistor comprises: setting a plasma wave velocity, which is adjusted by a gate overdrive voltage, as a first axis; setting an electronic drift velocity, which is adjusted by a drain-to-source voltage, as a second axis; setting a channel length as a third axis; and checking whether the plasma wave transistor is operated as a terahertz emitter according to a change in the performance parameter value of the plasma wave transistor on the basis of a relational expression among the first axis, the second axis, and the third axis.

10 Claims, 17 Drawing Sheets

(58) Field of Classification Search
USPC .................................................. 324/762.09
See application file for complete search history.

(56) References Cited

FOREIGN PATENT DOCUMENTS

| JP | 2006216646 A | 8/2006 | | |
|---|---|---|---|---|
| KR | 1020100061511 A | 6/2010 | | |
| KR | WO 2017115895 A1 * | 7/2017 | ............. | G01R 23/02 |

OTHER PUBLICATIONS

Teppe, et al., Terahertz Resonant Detection by Plasma Waves in Nanometric Transistors, Acta Physica Polonica A, vol. 113, No. 3, pp. 815-820, Mar. 2008.

Park, et al., Possibility and Design of Resonant Terahertz Emitters Based on Nanoscale Strained Silicon Plasma Wave Transistors with Enhanced Mobility, MNC 2013, Japan, Nov. 8, 2013.

Michael Dyakonov et al., Shallow Water Analogy for a Ballistic Field Effect Transistor: New Mechanism of Plasma Wave Generation by dc Current, Physical Review Letters, Oct. 11, 1993, pp. 2465-2468, vol. 71, No. 15.

* cited by examiner

METHOD FOR EVALUATING PERFORMANCE OF PLASMA WAVE TRANSISTOR

TECHNICAL FIELD

The present invention relates to a method of evaluating a semiconductor and a property of the semiconductor and, more particularly, to a design window used to evaluate a plasma wave transistor (PWT) and an evaluation method performed using the design window.

BACKGROUND ART

A terahertz (THz) wave may be undeveloped resources having a bandwidth from 100 gigahertz (GHz) to 10 THz and correspond to an intermediate area between an infrared light and a millimeter wave. Due to a high technical entry barrier difficult to overcome with a current technology level, the THz has been an unexplored technical field recognized as a THz gap. THz wave technology may belong to an optical field at the early stage. However, with developments of nano-level electronic element/substance technologies, the THz wave technology has been applied as a combination of optical engineering technology and electronic engineering technology.

In terms of the electronic engineering technology, research on a passive element such as a resonant tunneling diode (RTD) and a schottky barrier diode (SBD) has been actively conducted. Recently, III-V heterojunction bipolar transistor (HBT), and high-electron-mobility transistor (HEMT) elements has succeeded in an access to a block frequency of 1 THz, which allows a sub-THz operation. In terms of the optical engineering technology, developments of elements such as a photoconductive switch, optical rectification, difference-frequency generation (DFG), optical parametric, terahertz-quantum cascade lasers (THz-QCL), and uni-traveling-carrier photodiodes (UTC-PD) have been actualized to advance the THz technology.

Current nano-transistor technology has been continuously downscaled to 20 nanometers (nm) for achieving an increased operational frequency. However, an operation at a band of 500 GHz or more may be restricted despite a channel reduction in a transit-mode. A new concept element provided to solve this issue, a plasma wave transistor (PWT) may operate at a velocity corresponding to 10 to 100 times of a transit-mode electron drift velocity using a plasma wave defined as a space-time oscillating wave of a channel electron density. Research on a PWT for THz emission and detection element operating in a frequency domain higher than a block frequency of a transistor based on a plasma resonance phenomenon of a two-dimensional (2D) channel electron density has been conducted all over the world to be used as technology for filling the THz gap.

Since 1993 when Michael Shur, a professor at Rensselaer Polytechnic Institute (RPI) in the United States proposed for the first time, research on implementation and application of the THz emission and detection element using the PWT has been conducted in universities in the U.S., Japan, and Europe for about 10 years. However, there still exists a technical difficulty in evaluating the THz element and a property of the THz element at a commercialization level.

Technology for reaching a THz range using a resonator for a plasma wave, a correlation between a frequency of the plasma wave and a drain-to-source current, and a relationship between a plasma wave velocity and a drift velocity are theoretically explained in the following prior art documents.

(Prior art 1) Terahertz Emitters, Detectors and Sensors: Current Status and Future Prospects, M. Ghanashyam Krishna, Sachin D. Kshirsagar and Surya P. Tewari, intech.

(Prior art 2) Terahertz Resonant Detection by Plasma Waves in Nanometric Transistors, F. Teppe, A. El Fatimy, S. Boubanga, D. Seliuta, G. Valusis, B. Chenaud and W. Knap, Proceedings of the 13th International Symposium on ultra-fast phenomena in semi-conductors (UFPS).

DISCLOSURE OF INVENTION

Technical Goals

An aspect of the present invention provides a method and apparatus to solve an issue that a basic evaluation method of evaluating a performance to be provided by an element is insufficiently effective for an experiment of a resonance type plasma wave transistor (PWT) terahertz (THz) emitter based on a semi-conductive element in a related art so as to overcome a technical limit within which theoretical and experimental results are incomparable.

Technical solutions

According to an aspect of the present invention, there is provided a method of evaluating a performance of a plasma wave transistor (PWT), the method including: setting a plasma wave velocity adjusted based on a gate overdrive voltage to be a first axis; setting an electron drift velocity adjusted based on a drain-to-source voltage to be a second axis; and generating a design window including a relational expression between the first axis and the second axis and verifying whether the PWT operates as a terahertz emitter based on a change in a performance parameter value of the PWT.

An emission boundary of the design window may change based on a momentum relaxation time, the design window may determine the emission boundary using a plasma increment in association with the electron drift velocity and the plasma wave velocity, and the design window may calculate a maximum channel length to which a function of the terahertz emitter is guaranteed. Also, the emission boundary may be obtained using a graph edge indicating a minimum Mach number allowing an emission in the design window.

The emission boundary of the design window may change based on a change in a channel mobility or a channel length, and the design window may be generated by acquiring an emission boundary point in response to an input of a user and inputting a performance parameter corresponding to the acquired emission boundary point to the relational expression.

According to another aspect of the present invention, there is also provided a method of evaluating a performance of a PWT, the method including: setting a plasma wave velocity adjusted based on a gate overdrive voltage to be a first axis; setting an electron drift velocity adjusted based on a drain-to-source voltage to be a second axis; setting a channel length to be a third axis; and generating a design window including a relational expression of the first axis, the second axis, and the third axis and verifying whether the PWT operates as a terahertz emitter based on a change in a performance parameter value of the PWT.

The design window may determine a range of an electron drift velocity, a plasma wave velocity, and a channel length guaranteeing a function of the terahertz emitter by simultaneously three-dimensionally expressing a change in an emission boundary based on a change in the channel length and a channel mobility.

The design window may be designed to include a physical condition satisfying an equation using a characteristic that a mobility of a plasma wave is classified into an upstream component and a downstream component and an emission of the terahertz emitter occurs in response to a multiple reflection.

According to still another aspect of the present invention, there is also provided method of evaluating a performance of a PWT, the method including determining a physical condition used internally to a channel of a terahertz emitter in advance and inputting the physical condition to a performance parameter of a design window, generating visual emission phases, each corresponding to a plurality of substances for a PWT element, in response to a change in the performance parameter through a three-dimensional (3D) plot, and comparing the generated visual emission phases and displaying a comparison result on a display, wherein the design window sets a plasma wave velocity adjusted based on a gate overdrive voltage to be a first axis, sets an electron drift velocity adjusted based on a drain-to-source voltage to be a second axis, and sets a channel length to be a third axis, and wherein the design window represents whether the PWT operates as the terahertz emitter in response to a change in a performance parameter value of the PWT based on a relational expression of the first axis, the second axis, and the third axis.

The design window may determine a range of an electron drift velocity, a plasma wave velocity, and a channel length guaranteeing a function of the terahertz emitter by simultaneously three-dimensionally expressing a change in an emission boundary based on a change in the channel length and a channel mobility.

The design window may be designed to include a physical condition satisfying an equation using a characteristic that a mobility of a plasma wave is classified into an upstream component and a downstream component and an emission of the terahertz emitter occurs in response to a multiple reflection.

Effects

According to an example embodiment, in an evaluation of a plasma wave transistor (PWT) emitter, it is possible to acquire a relationship of performance parameters affecting an emission performance by determining the performance parameters and design a design window configured to verify a performance to be provided by an emitter in theory prior to an experiment so as to easily evaluate a PWT to operate as a terahertz oscillator. Also, it is possible to contribute to development of a PWT terahertz emitter using a new material through an emitter performance evaluation with respect to various substances applicable to a semi-conductive element.

BEST MODE FOR CARRYING OUT THE INVENTION

According to an example embodiment, there is provided a method of evaluating a performance of a plasma wave transistor (PWT), the method including setting a plasma wave velocity adjusted by a gate overdrive voltage to be a first axis; setting an electron drift velocity adjusted by a drain-to-source voltage to be a second axis; and generating a design window including a relational expression between the first axis and the second axis and inspecting whether the PWT operates as a terahertz emitter based on a change in a performance parameter value of the PWT.

Mode for Carrying Out the Invention

Hereinafter, a common concept adopted in the following example embodiments will be broadly described and then, technologies for implementing the respective embodiments will be provided in sequence.

A plasma wave transistor (PWT) may operate using a gate overdrive voltage $U_O$ $(=U_G-U_T)$ corresponding to a difference between a gate voltage $U_G$ and a threshold voltage $U_T$ and a drain-to-source voltage $U_{DS}$. The gate overdrive voltage $U_O$ and the drain-to-source voltage $U_{DS}$ may be used to determine a plasma wave velocity s and an electron drift velocity $v_o$. Thus, using a relational expression between the plasma wave velocity s and the electron drift velocity $v_o$ based on axes of the plasma wave velocity s and the electron drift velocity $v_o$, a point from which the PWT functions as a terahertz emitter and a terahertz area corresponding to the PWT may be verified.

In the following example embodiments, a design window may be designed by applying the aforementioned common concept, and a boundary point at which an emission occurs may be verified differently for each design window. Related descriptions will be provided as below.

Figure 1:
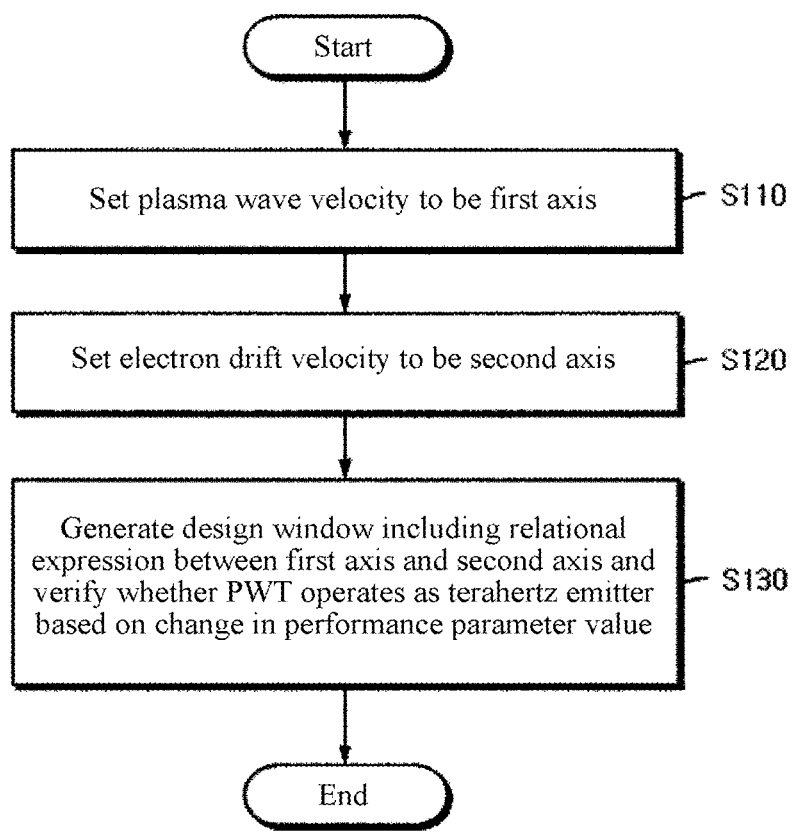
FIG. 1 is a flowchart illustrating a common concept of evaluating a performance of a plasma wave transistor (PWT) according to an example embodiment.

FIG. 1 is a flowchart illustrating a common concept of evaluating a performance of a PWT according to an example embodiment and suggests a common concept discussed in the foregoing explanation.

In operation S110, a PWT evaluation apparatus may set a plasma wave velocity adjusted by a gate overdrive voltage to be a first axis. In operation S120, the PWT evaluation apparatus may set an electron drift velocity adjusted by a drain-to-source voltage to be a second axis.

In operation S130, the PWT evaluation apparatus may generate a design window including a relational expression between the first axis and the second axis and inspect whether the PWT operates as a terahertz emitter based on a change in a performance parameter value of the PWT.

FIRST EMBODIMENT

In the foregoing method, operations S110 and S120 may be represented by equations as shown below. The equations include signs and parameters as follows.

$U_o$: gate overdrive voltage
$U_T$: threshold voltage
$U_G$: gate voltage
$U_{DS}$: drain-to-source voltage
$\omega''$: plasma wave increment
L: channel length
$\tau_p$: momentum relaxation time
μ: channal mobility
m*: electron effective mass
e: electric charge
$v_{inj}$: injection velocity
$k_B$: Boltzmann constant
T: temperature $$\omega'' = \frac{s^2 - v_0^2}{2Ls} \ln\left|\frac{s + v_0}{s - v_0}\right| - \frac{1}{2\tau_p} \qquad \text{[Equation 1]}$$

Equation 1 may be used to obtain a speed of increasing an amplitude of a plasma wave per minute. Based on a characteristic that a field-effect transistor (FET) is adjusted by the gate overdrive voltage and the drain-to-source voltage, one-plot axis may be configured using parameters including ① a plasma wave velocity adjusted by the gate overdrive voltage and ② an electron velocity adjusted by the drain-to-source voltage.

For example, using Equation 1, points at which from which an emission is to occur may be verified and marked. Here, the points may be, for example, points at which a condition "$\omega''>0$" is satisfied. The marked points may be connected by a line to indicate an area.

$$\tau_p = \frac{\mu m^*}{e} \qquad \text{[Equation 2]}$$

$$v_{inj} = \sqrt{\frac{2k_B T}{\pi m^*}} \qquad \text{[Equation 3]}$$

$$s = \sqrt{\frac{eU}{m^*}} \qquad \text{[Equation 4]}$$

In Equation 2 and Equation 3, values may be determined based on properties of substances. The emission window may be designed by determining a gate overdrive voltage $U_O$, obtaining an plasma wave velocity s using Equation 4, determining points at which a plasma wave increment $\omega''$ is zero and an injection velocity $v_{inj}$ obtained by substituting values of an electron drift velocity $v_o$ to Equation 1 as a boundary, and connecting the points and the electron drift velocity $v_o$.

Figure 2:
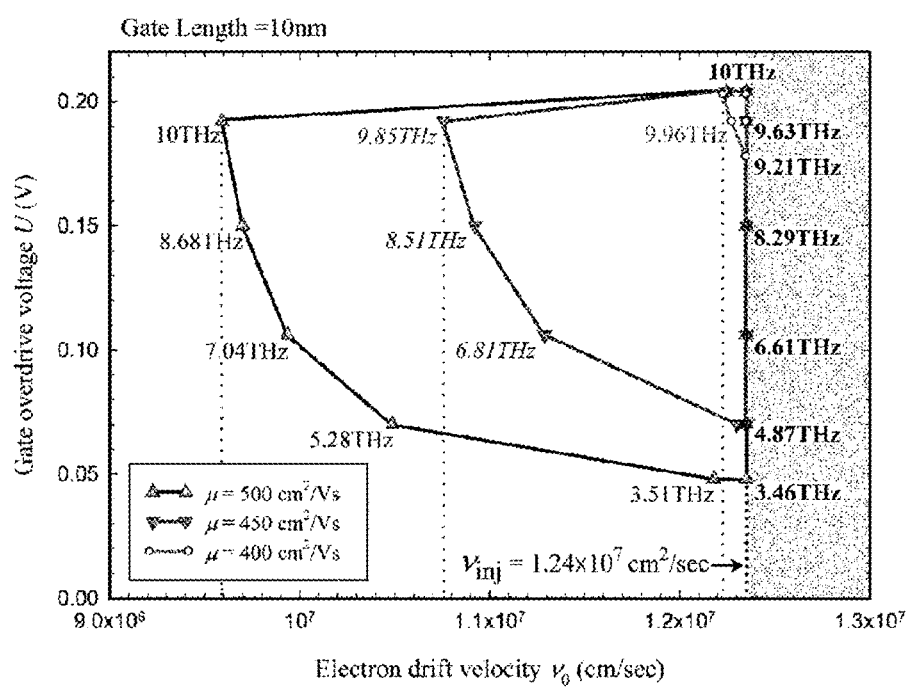
FIGS. 2 and 3 are diagrams illustrating a change in an emission window based on a change in a performance parameter according to a first embodiment.
Figure 3:
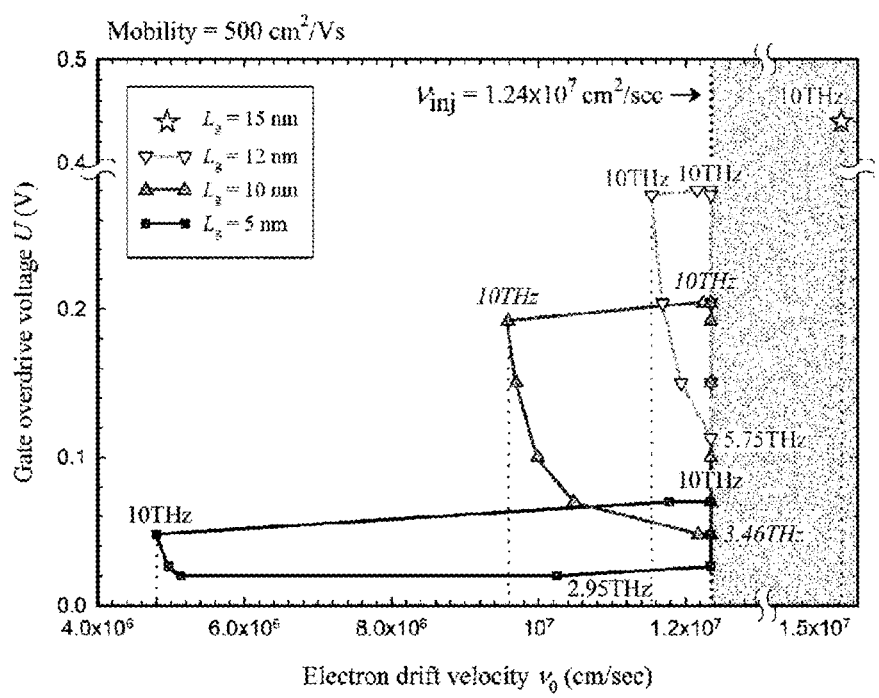

FIGS. 2 and 3 are diagrams illustrating a change in an emission window based on a change in a performance parameter and illustrate emission windows based on a change in a channel mobility μ and a change in a channel length L, respectively.

In the aforementioned embodiment, an emission boundary of a design window may change based on a change in a channel length. The design window may be generated by acquiring an emission boundary point in response to a user input and inputting a performance parameter corresponding to the acquired emission boundary point to a relational expression as discussed above. The design window may be generated by determining an appropriate parameter of a channel mobility or a channel length to be acquired by experimentally verifying in advance of an experiment and a process associated with a PWT, calculating the momentum relaxation time and the injection velocity, and inputting the momentum relaxation time and the injection velocity to the relational expression between the first axis and the second axis. Thereafter, verification may be performed on the plasma wave velocity and the electron drift velocity at the boundary of the design window so as to evaluate a performance of the PWT for operating as an emitter.

However, a relatively large amount of time may be used to verify an emission boundary point by substituting a value to an equation. Thus, a relational expression to determine a boundary with a reduced amount of operation may be used in the following embodiment.

SECOND EMBODIMENT

To this end, in a method of evaluating a performance of a PWT according to the present embodiment, the design window may have an emission boundary changing based on a momentum relaxation time, determine the emission boundary based on a plasma wave increment relative to an electron drift velocity and a plasma wave velocity, and calculate a maximum channel length guaranteeing a function of the terahertz emitter. Specifically, the emission boundary may be obtained using a graph edge representing a minimum Mach number allowing an emission in the design window.

Figure 4:
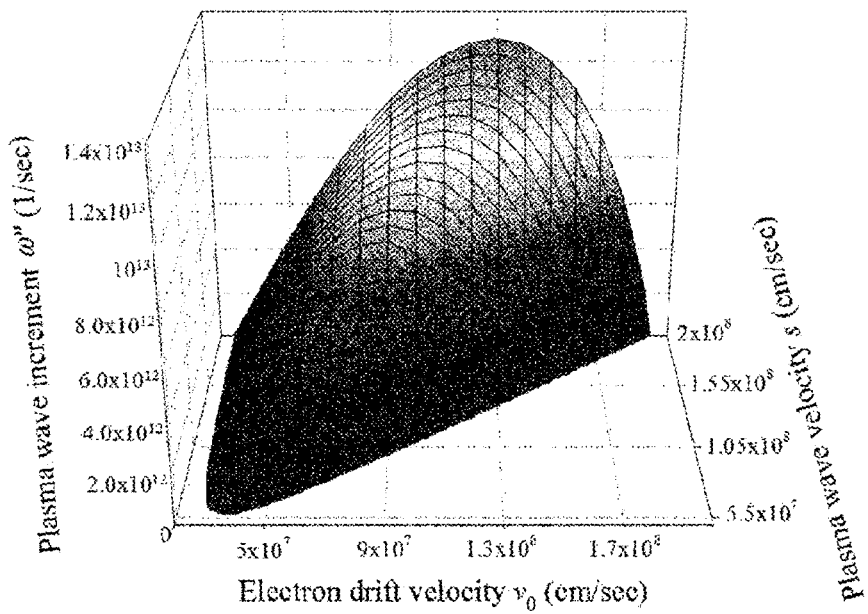
FIGS. 4 through 8 are drawings illustrating an emission window based on a change in a performance parameter according to a second embodiment.

FIG. 4 illustrates a plot indicating a plasma wave increment $\omega''$ changing based on a plasma wave velocity s and an electron drift velocity $v_o$. In this example, according to an increase in the plasma wave increment $\omega''$, an increment in an amplitude of wave may increase and a speed of increasing of the amplitude may also increase.

Table 1 shows physical conditions for producing the terahertz emitter, and Equation 5 through Equation 7 may be obtained therefrom.

TABLE 1

| Physical Condition for Plasma Wave | Criteria |
| --- | --- |
| Underdamped | $\omega \tau_p > 1$ |
| Instability | $v_0 < v_{inj} < s$ |
| Increment | $\omega'' > 0$ |
| Frequency | $f < 10$ THz |

$$s = \left(\tau_p |1 - M^2| \ln\left|\frac{1+M}{1-M}\right|\right)^{-1} L \qquad \text{[Equation 5]}$$

$$s = (1 \times 10^{13}) \frac{4L}{|1 - M^2|} \qquad \text{[Equation 6]}$$

$$s = \frac{4L}{2\pi\tau_p |1 - M^2|} \qquad \text{[Equation 7]}$$

Here, M denotes a Mach number and, for example, $M = s/v_o$.

Figure 5:
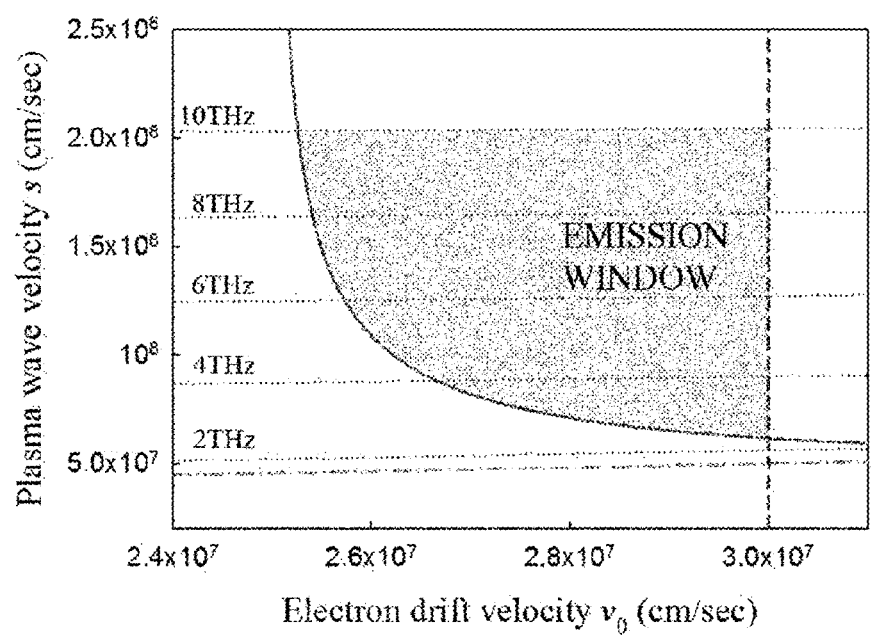

FIG. 5 illustrates an emission window indicated by a blue line representing Equation 5, a 10 terahertz (THz)-dotted line representing Equation 6 and a green line representing Equation 7 based on Table 1. Using Equation 5 through Equation 7, the emission window may be much quickly verified when compared to the first embodiment.

The design window of FIG. 5 may be proposed in an aspect that characteristics are shown when entering an area in which an emission is not allowed from each boundary. Conditions associated with the characteristics may be referred to as the physical condition as shown in Table 1. For example, all signs of equations in the criteria of Table 1 may be changed to an equal sign '=' such that each of the equations indicates the boundary. Subsequently, the equations may be changed to be functions based on the plasma wave velocity s. In this example, the functions may correspond to Equation 5 through Equation 7.

Figure 6:
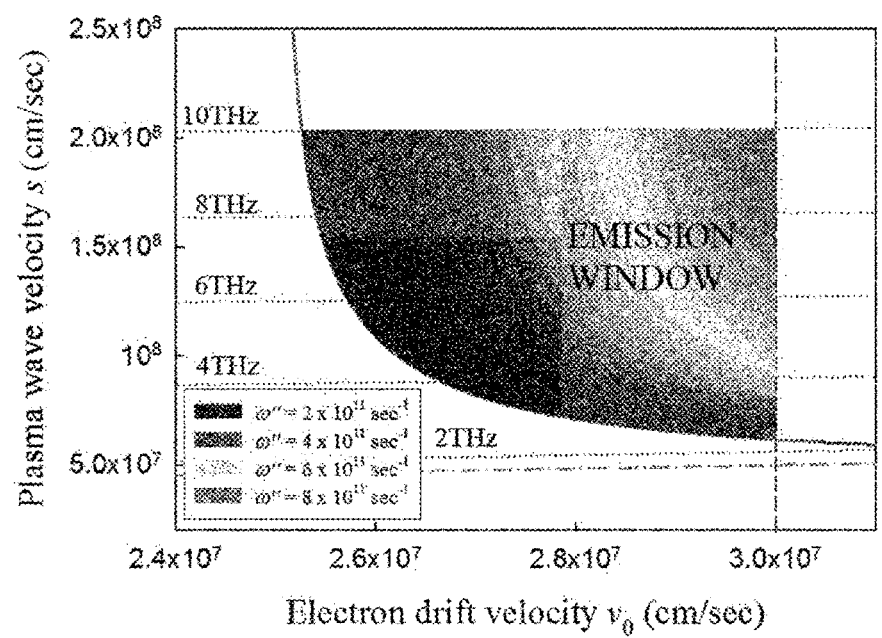
Figure 7:
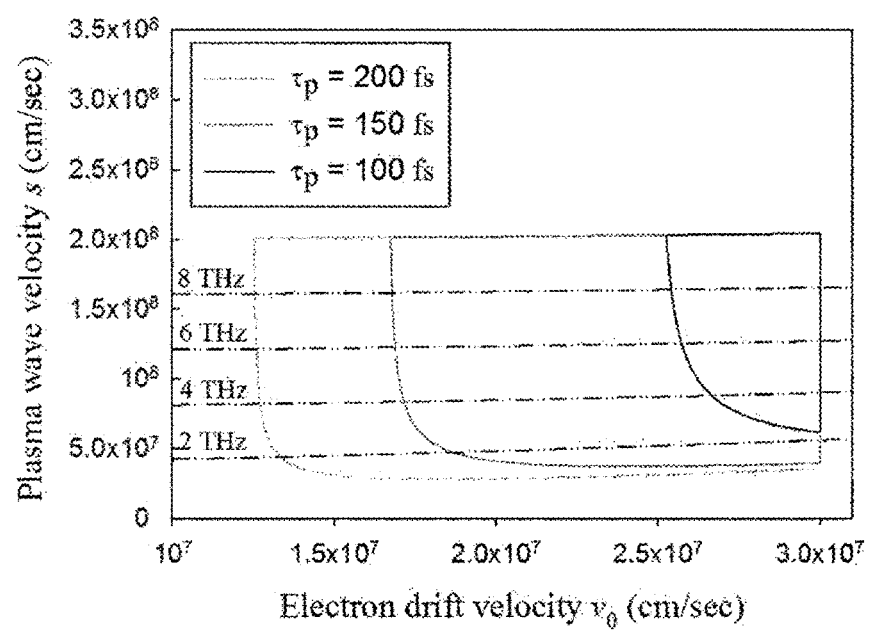

FIG. 6 illustrates a plot integrally representing the plots of FIGS. 4 and 5. Referring to FIG. 6, a point at which a plasma wave increment ω" is maximized may be verified. Also, FIG. 7 illustrates a change in an emission window based on a momentum relaxation time $\tau_p$.

Figure 8:
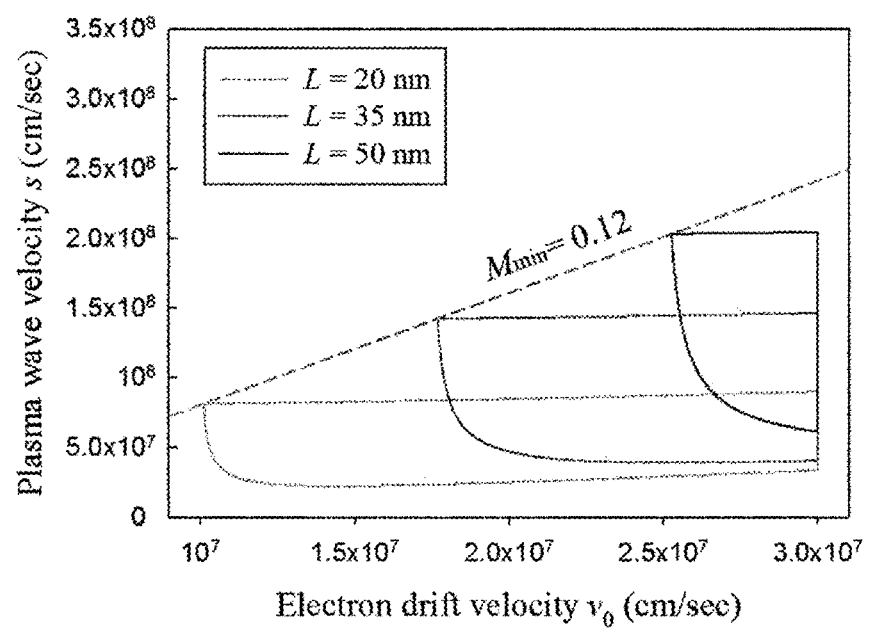

FIG. 8 illustrates an emission window changing based on a change in a gate length. Referring to FIG. 8, information associated with a maximum channel length L to which a predetermined PWT is allowed to function as a terahertz emitter may be verified using Equation 8 and Equation 9 as shown below.

$$M_{min} = \frac{\exp(4\tau_p \times 10^{13})^{-1} - 1}{\exp(4\tau_p \times 10^{13})^{-1} + 1} \quad \text{[Equation 8]}$$

$$L_{max} = \frac{s_{max}|1 - M_{min}^2|}{4 \times 10^{13}} \quad \text{[Equation 9]}$$

The foregoing descriptions of the variables are also applicable here.

For example, when it is assumed that a desirable range is approximately 10 THz, Equation 9 may be obtained by changing Equation 6 represented by a 10 THz-boundary line in an aspect that a left and uppermost edge indicates a minimum Mach number allowing an emission. Concisely, Equation 9 may be obtained by applying Equation 8 to Equation 6.

Third Embodiment

The following embodiment suggests a design window to which a new physical condition is applied.

Figure 9:
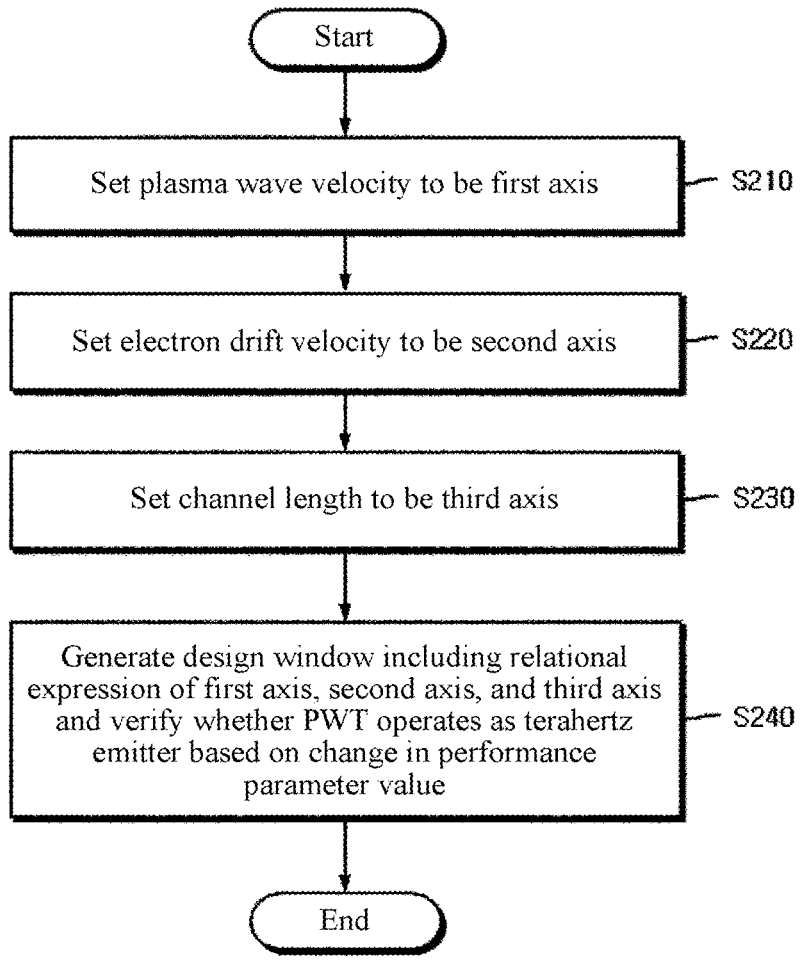
FIG. 9 is a flowchart illustrating a method of evaluating a performance of a PWT according to another example embodiment and suggests a third embodiment in which a new physical condition is applied to a design window.

FIG. 9 is a flowchart illustrating a method of evaluating a performance of a PWT according to another example embodiment. In this drawing, a new physical condition is applied to a design window.

In operation S210, a PWT performance evaluation apparatus may set a plasma wave velocity adjusted by a gate overdrive voltage to be a first axis.

In operation S220, the PWT performance evaluation apparatus may set an electron drift velocity adjusted by a drain-to-source voltage to be a second axis.

In operation S230, the PWT performance evaluation apparatus may set a channel length to be a third axis.

In operation S240, the PWT performance evaluation apparatus may generate a design window including a relational expression of the first axis, the second axis, and the third axis and inspect whether the PWT operates as a terahertz emitter based on a change in a performance parameter value of the PWT.

In this example, the design window may three-dimensionally express a change in an emission boundary based on a change in a channel length and a channel mobility simultaneously, and determine a range of an electron drift velocity, a plasma wave velocity, and a channel length guaranteeing a function of the terahertz emitter. Also, the design window may be designed to include a physical condition satisfying an equation "(plasma wave velocity−the electron drift velocity)×momentum relaxation time>channel length" using a characteristic that a mobility of the plasma wave is classified into an upstream component and a downstream component and an emission of the terahertz emitter occurs in response to a multiple reflection.

In terms of a new physical condition applied in the present embodiment, $s\tau_p$ denotes a distance to which the plasma wave is promoted until an amplitude reaches a value of exp[−1] (≅0.368). When the value is less than a channel length L, an amplitude for the multiple reflection may be insufficiently guaranteed.

Since the plasma wave is present internal to a channel, a condition $s\tau_p > L$ may be divided into a condition $(s-v_o)\tau_p > L$ and a condition $(s+v_o)\tau_p > L$ based on a wave promotion direction. This may be represented on a design window plot using equations based on plasma wave velocity s as shown below.

$$\frac{(S + V_0)\tau_p}{L} = 1 \longrightarrow s = \frac{L}{\tau_p} - v_0 \quad \text{[Equation 10]}$$

$$\frac{(s - v_0)\tau_p}{L} = 1 \longrightarrow s = \frac{L}{\tau_p} + v_0 \quad \text{[Equation 11]}$$

Here, variables each denote as follows.
L: channel length
$\tau_p$: momentum relaxation time
s: plasma wave velocity
$v_o$: electron drift velocity A plot within a physical condition for determining a lower boundary of the emission window is illustrated with reference to FIG. 10. Also, the physical condition of FIG. 10 may be expressed by Equation 12 as below.

$$\begin{aligned}
\omega\tau_p > 1 &\longrightarrow s = \frac{4L}{2\pi\tau_p|1 - M^2|} \\
s\tau_p > L \Bigg\langle \begin{matrix} (s - v_0)\tau_p > L &\longrightarrow s = \dfrac{L}{\tau_p} + v_0 \\ (s + v_0)\tau_p > L &\longrightarrow s = \dfrac{L}{\tau_p} - v_0 \end{matrix} \\
\omega'' > 0 &\longrightarrow s = \left(\tau_p|1 - M^2|\ln\left|\frac{1 + M}{1 - M}\right|\right)^{-1} L
\end{aligned} \quad \text{[Equation 12]}$$

Figure 10:
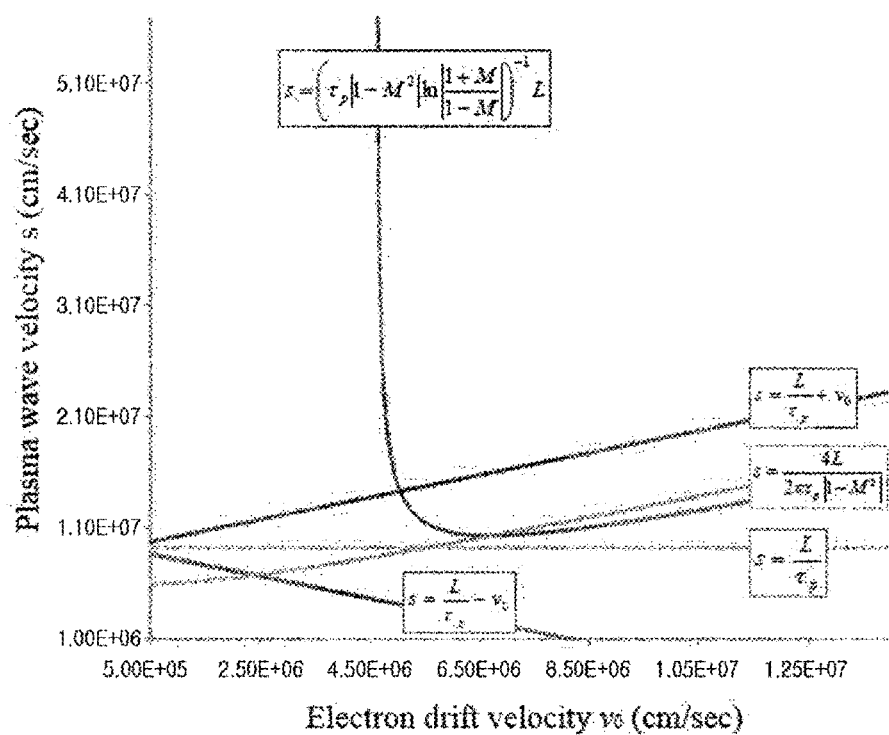
FIGS. 10 through 13 are diagrams illustrating an emission window and a changing phase of the emission window to describe a method of determining a new boundary according to the third embodiment.

Here, variables denote the following.
ω": plasma wave increment
L: channel length
$\tau_p$: momentum relaxation time M: mach number As illustrated by the plot of FIG. 10, a condition $(s-v_o)\tau_p>L$ associated with a upstream component in a channel may be a significant factor for determining a lower boundary of an emission window.

Figure 11:
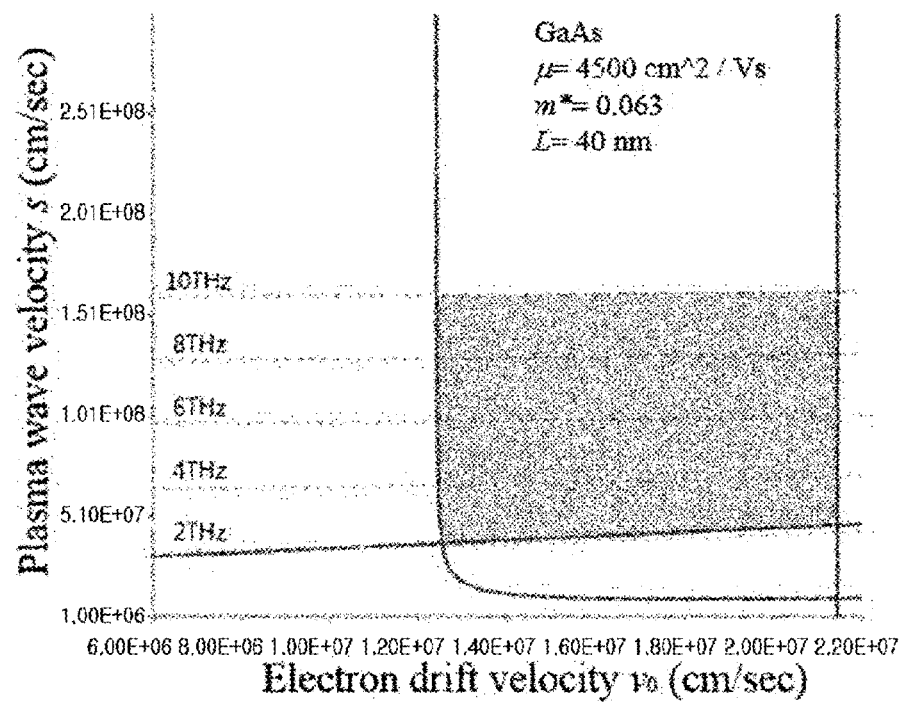

An emission window of a new boundary is illustrated with reference to FIG. 11. In FIG. 11, variables denote the following.

ω": plasma wave increment
L: channel length
$\tau_p$: momentum relaxation time
μ: channel mobility
m*: electron effective mass
s: plasma wave velocity
$v_o$: electron drift velocity In FIG. 11, as the channel length L decreases, a condition $\omega\tau_p>L$ may be stronger than the condition $(s-v_o)\tau_p>L$. The third embodiment is suggested based on characteristics that a movement of the plasma wave is classified into an upstream component and a downstream component and an emission of a terahertz emitter of the PWT occurs in response to a multiple reflection.

In consideration of the characteristics, the physical condition $(s-v_o)\tau_p>L$ may be required. Thus, by adding the physical condition, $$s = \frac{L}{\tau_p} + v_0$$

may be obtained in Equation 12 and expressed by a plot as indicated by a red line in FIG. 11. As such, by adding the new physical condition, the emission window may be provided with increased accuracy.

Figure 12:
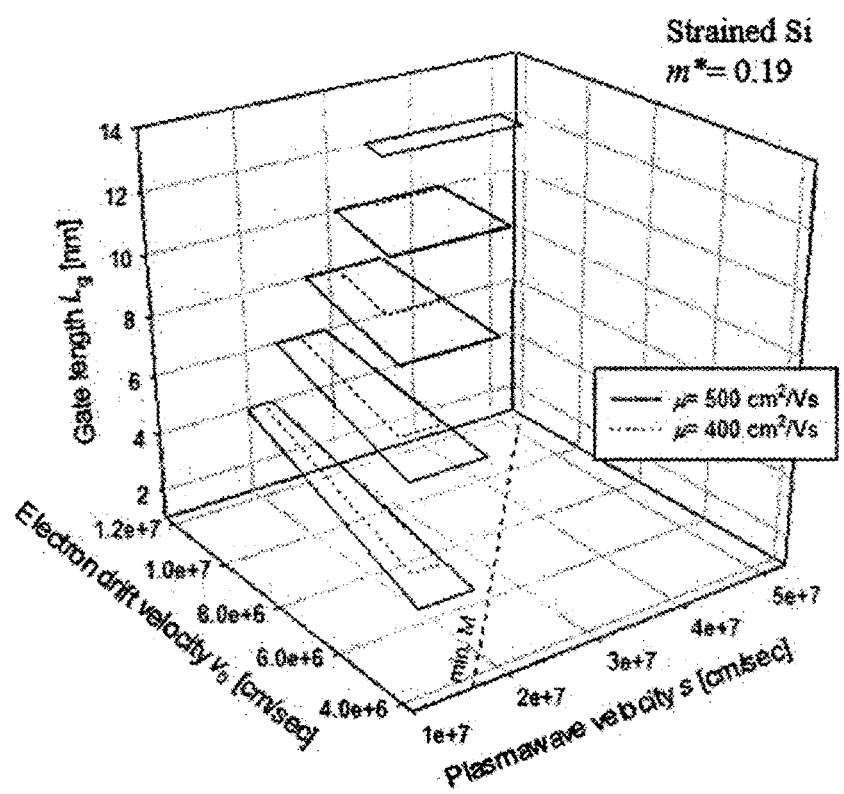

FIG. 12 illustrates a 3D plot expressing an emission window varying based on a change in a gate length and a mobility including $$s = \frac{L}{\tau_p} + v_0$$

of Equation 12.

Based on a plot described with reference to FIG. 11, it is possible to verify a channel length to which an emitter is to be implemented with respect to a predetermined substance by adding elements of Equation 9. In this instance, it is also possible to verify ranges of a plasma wave velocity and an electron velocity based on the 3D plot of FIG. 12.

In FIG. 12, the 3D plot shows intervals of a plasma wave velocity s and an electron drift velocity $v_o$ in which a plasma wave terahertz emitter formed of strained Silicon (Si) (m*=0.19 $m_o$) operates as an emitter. For example, when a mobility of an element having a channel length of 14 nm corresponds to approximately 500 square centimeters per volt-second (cm²/$V_s$), the plasma wave velocity $v_o$ in a range from about $1.1 \times 10^7$ centimeters per second (cm/sec) to $1.23 \times 10^7$ cm/sec and the electron drift velocity s in a range from about $3.5 \times 10^7$ cm/sec to $5.1 \times 10^7$ cm/sec may need to be applied to allow the corresponding element to operate as the terahertz emitter.

Figure 13:
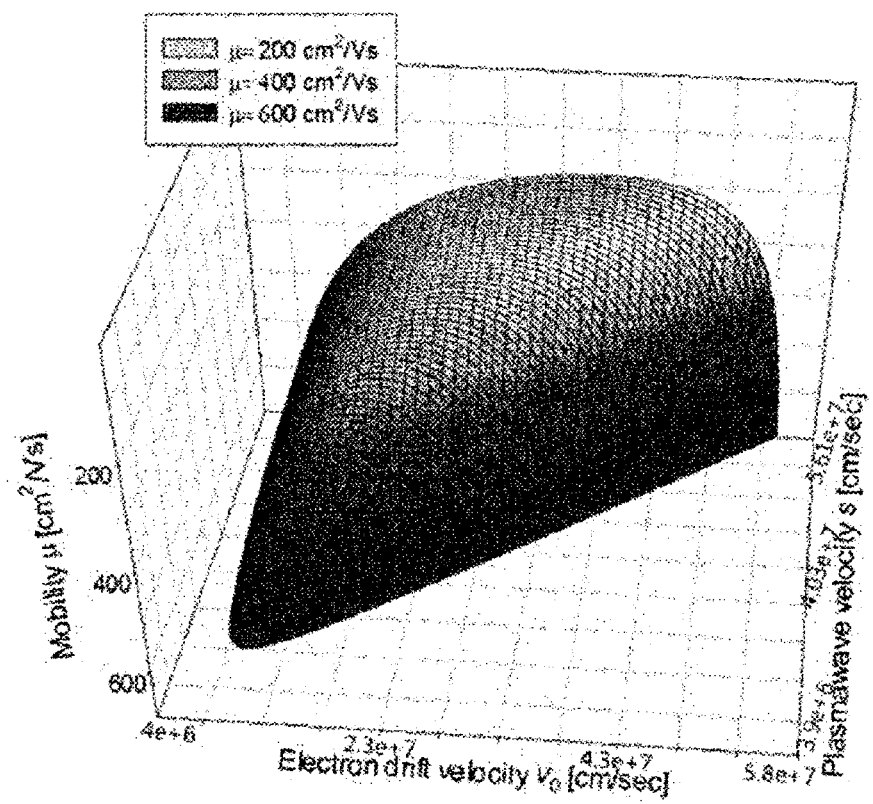

FIG. 13 illustrates a 3D plot expressing an emission window phase changing based on a change in mobility using Equation 13 below.

$$\mu = \frac{e}{2m^*}\left[\frac{s^2 - v_0^2}{2Ls}\ln\left|\frac{s+v_0}{s-v_0}\right|\right]^{-1} \quad \text{[Equation 13]}$$

Here, e denotes an electric charge.

Examples of applying such emission window will be provided with reference to the following descriptions.

Figure 14:
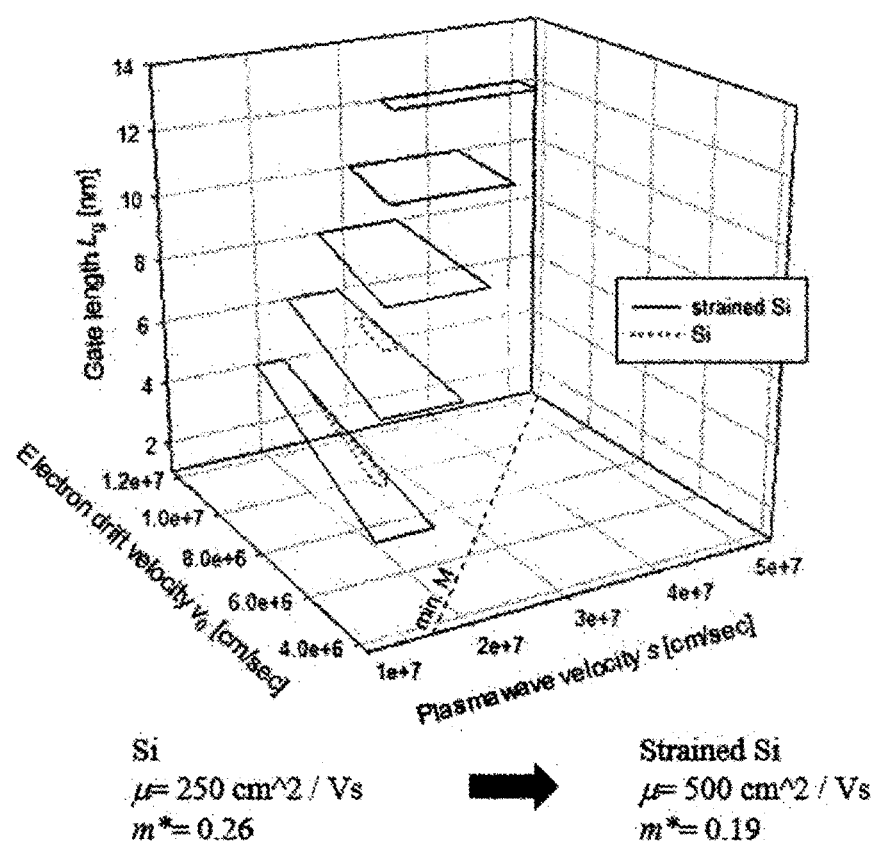
FIGS. 14 through 16 are diagrams of an emission window plot illustrating an actual application example according to the example embodiment of FIG. 9.

FIG. 14 illustrates a plot expressing that an emission window is expanded and a maximum gate length increases when a strained Si having a mobility enhanced in comparison to that of a general Si is applied.

Figure 15:
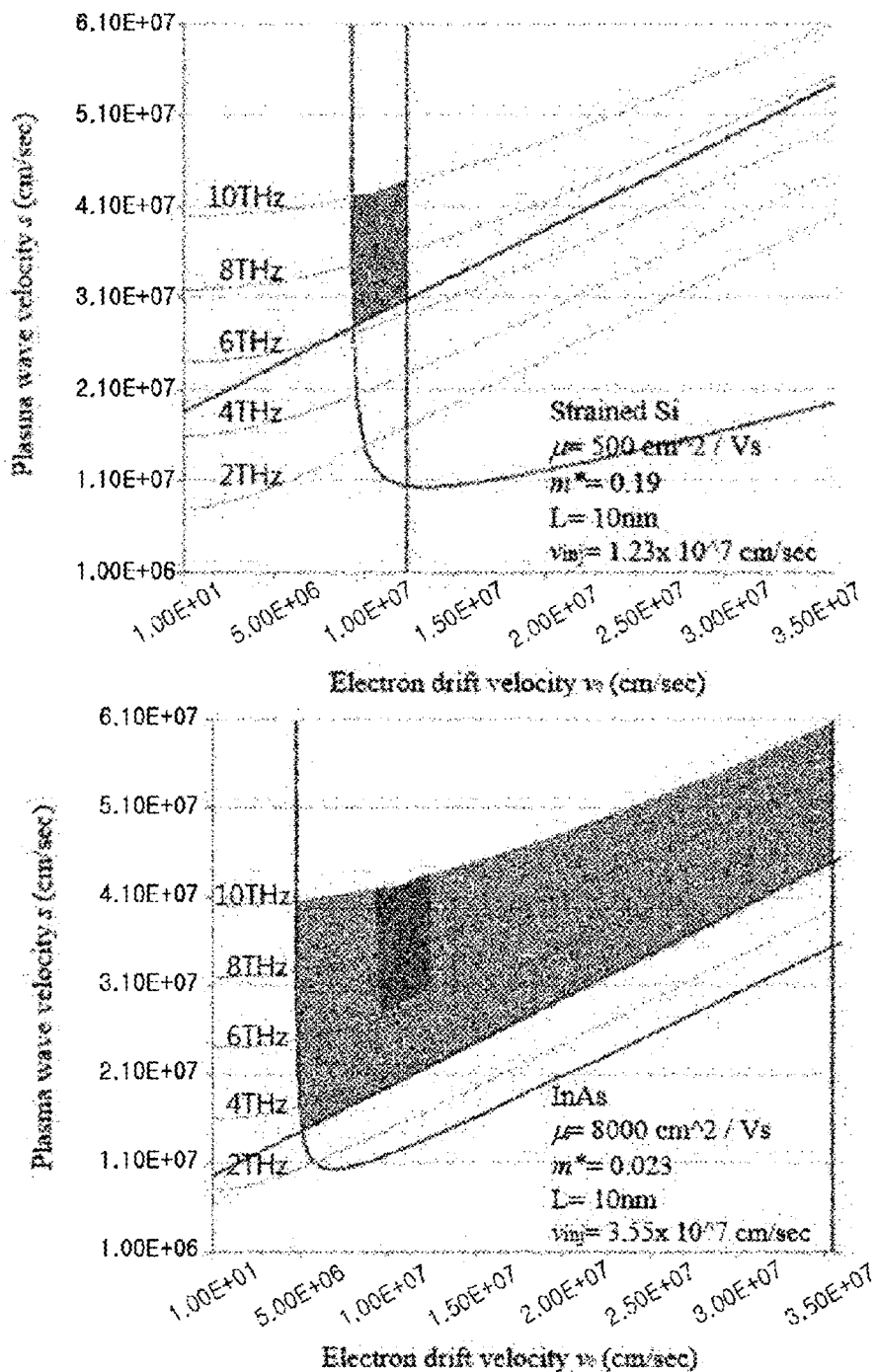

FIG. 15 illustrates a plot expressing an emission area obtained when elements of a strained Si and an indium arsenide (InAs) operate as a terahertz emitter under the same gait length. In FIG. 15, although a plasma wave velocity s and an electron drift velocity $v_o$ required to obtain a desired frequency are the same based on a gate length, whether such values are to be acquired may be determined based on a property of a substance.

Figure 16:
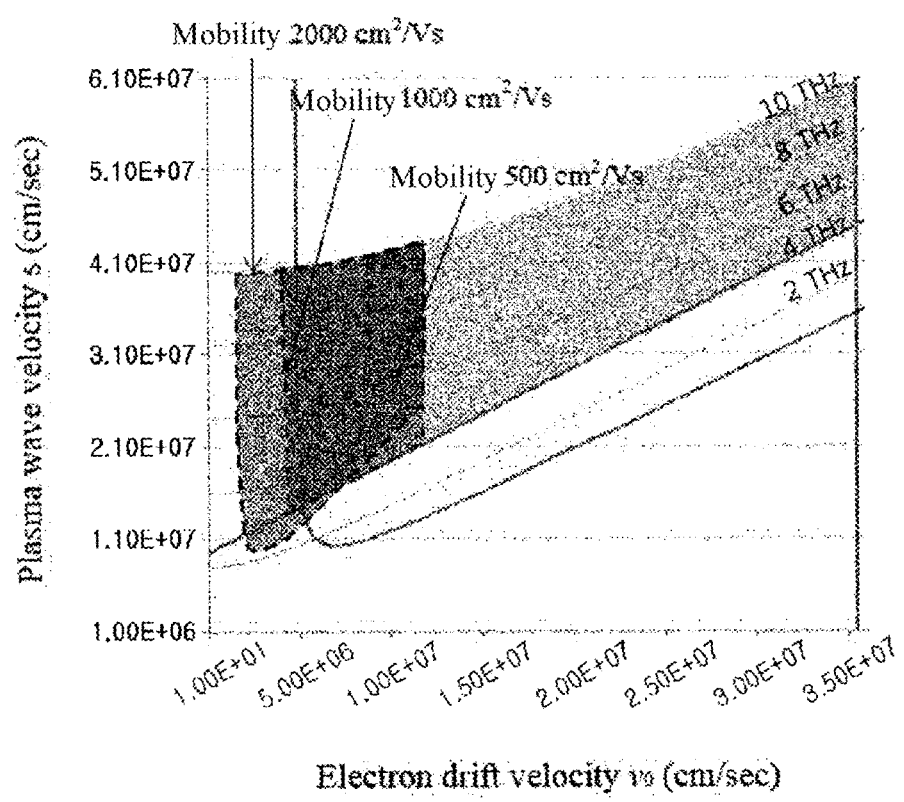

FIG. 16 is a graph illustrating a change in an emission window based on a mobility. The graph represents that a suggested element is possible to operate as an emitter at an electron drift velocity lower than that of an InAs element according to an increase in a mobility of the suggested element.

For example, the InAs element may operate at an electron drift velocity of $V_0=4.7\times10^6$ cm/sec or more. Also, an element of strained Si having a mobility of 2000 may operate at an electron drift velocity of $v_0=2.3\times10^6$ cm/sec or more, and an element of strained Si having a mobility of 1000 may operate at en electron drift velocity of $v_0=4.6\times10^6$ cm/sec or more.

Figure 17:
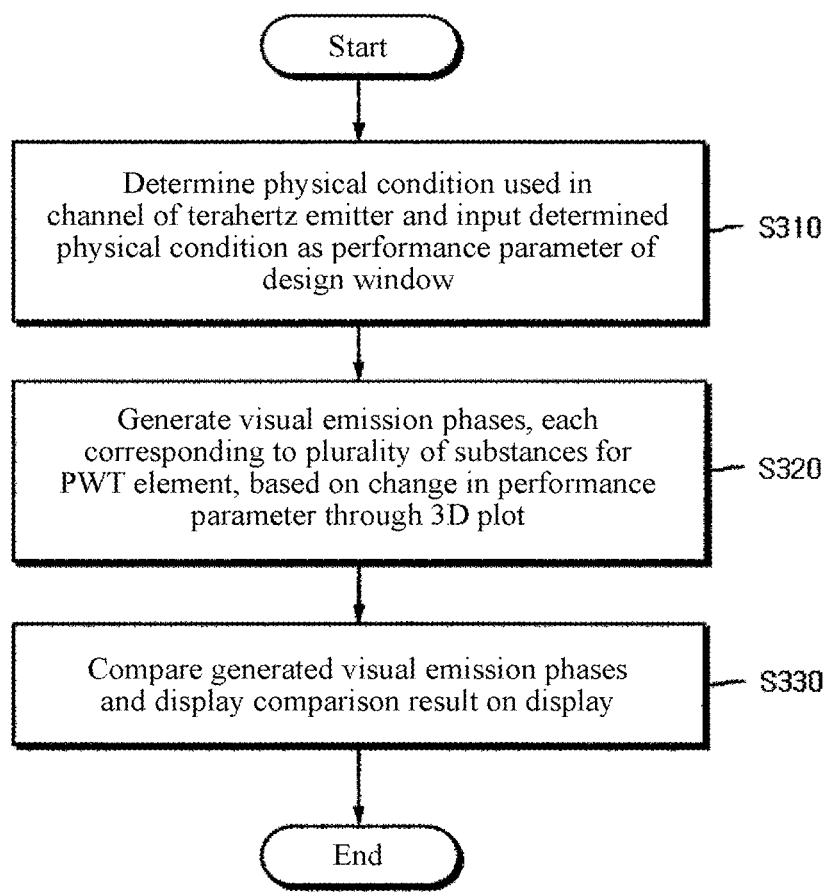
FIG. 17 is a flowchart illustrating a method of evaluating a performance of a PWT according to still another example embodiment and suggests a technical method of comparing and evaluating various substances.

FIG. 17 is a flowchart illustrating a method of evaluating a performance of a PWT according to still another example embodiment and suggests a technical method of comparing and evaluating various substances.

In operation S310, a PWT performance evaluation apparatus may determine a physical condition used in a channel of a terahertz emitter and input the determined physical condition as a performance parameter of a design window.

In this instance, the design window may set a plasma wave velocity adjusted by a gate overdrive voltage to be a first axis, set an electron drift velocity adjusted by a drain-to-source voltage to be a second axis, set a channel length to be a third axis, and represent whether a PWT operates as a terahertz emitter in response to a change in a performance parameter value based on a relational expression of the first axis, the second axis, and the third axis.

Also, the design window may three-dimensionally express a change in an emission boundary based on a change in the channel length and a channel mobility simultaneously and determine a range of an electron drift velocity, a plasma wave velocity, and a channel length guaranteeing a function of the terahertz emitter.

Furthermore, the design window may be designed to include a physical condition satisfying an equation "(plasma wave velocity−electron drift velocity)×momentum relaxation time>channel length) using characteristics that a movement of a plasma wave is classified into an upstream component and a downstream component and an emission of the terahertz emitter occurs in response to a multiple reflection.

In operation S320, the PWT performance evaluation apparatus may generate visual emission phases, each corresponding to a plurality of substances for a PWT element, based on a change in the performance parameter through a 3D plot.

In operation S330, the PWT performance evaluation apparatus may compare the generated visual emission phases and display a comparison result on a display.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

INDUSTRIAL APPLICABILITY

According to an example embodiment, in an evaluation of a plasma wave transistor (PWT) emitter, it is possible to acquire a relationship of performance parameters affecting an emission performance by determining the performance parameters and design a design window configured to verify a performance to be provided by an emitter in theory prior to an experiment so as to easily evaluate a PWT operable as a terahertz oscillator. Also, it is possible to contribute to development of a PWT terahertz emitter using a new material through an emitter performance evaluation with respect to various substances applicable to a semi-conductive element.

To this end, the present embodiments propose equations for predicting the PWT emitter by determining parameters such as an electron drift velocity, a plasma wave velocity, a channel length, and a substance for determining a performance of the terahertz emitter. In such process, the plasma wave velocity may be adjusted by a gate overdrive voltage and the electron drift velocity may be adjusted based on a drain-to-source voltage. The plasma wave velocity and the electron drift velocity may be set as an x axis and a y axis of one graph, and the channel length may be additionally set as a z axis of the graph. By representing an equation of a relationship of the plasma wave velocity, the electron drift velocity, and the channel length using a three-dimensional (3D) graph, desired magnitudes of s and $v_o$ to be applied at a predetermined channel length L to implement the terahertz emitter may be easily verified.

Furthermore, with a proposal of a method of evaluating a performance of an element by determining parameters and arranging the parameters on evaluation axes, there may be provided technology used for developing an element using a material having not been applied to a typical terahertz emitter.

The invention claimed is:

1. A method of evaluating a performance of a plasma wave transistor (PWT), the method comprising:
   setting a plasma wave velocity adjusted based on a gate overdrive voltage to be a first axis;
   setting an electron drift velocity adjusted based on a drain-to-source voltage to be a second axis; and
   generating a design window including a relational expression between the first axis and the second axis and verifying whether the PWT operates as a terahertz emitter based on a change in a performance parameter value of the PWT.

2. The method of claim 1, wherein an emission boundary of the design window changes based on a change in a channel mobility or a channel length, and
   the design window is generated by acquiring an emission boundary point in response to an input of a user and inputting a performance parameter corresponding to the acquired emission boundary point to the relational expression.

3. The method of claim 1, wherein an emission boundary of the design window changes based on a momentum relaxation time,
   the design window determines the emission boundary using a plasma increment in association with the electron drift velocity and the plasma wave velocity, and
   the design window calculates a maximum channel length to which a function of the terahertz emitter is guaranteed.

4. The method of claim 3, the emission boundary is obtained using a graph edge indicating a minimum Mach number allowing an emission in the design window.

5. A method of evaluating a performance of a plasma wave transistor (PWT), the method comprising:
   setting a plasma wave velocity adjusted based on a gate overdrive voltage to be a first axis;
   setting an electron drift velocity adjusted based on a drain-to-source voltage to be a second axis;
   setting a channel length to be a third axis; and
   generating a design window including a relational expression of the first axis, the second axis, and the third axis and verifying whether the PWT operates as a terahertz emitter based on a change in a performance parameter value of the PWT.

6. The method of claim 5, wherein the design window determines a range of an electron drift velocity, a plasma wave velocity, and a channel length guaranteeing a function of the terahertz emitter by simultaneously three-dimensionally expressing a change in an emission boundary based on a change in the channel length and a channel mobility.

7. The method of claim 5, wherein, using a characteristic that a mobility of a plasma wave is classified into an upstream component and a downstream component and an emission of the terahertz emitter occurs in response to a multiple reflection, the design window is designed to include a physical condition satisfying the following equation:

$$(\text{Plasma wave velocity} - \text{electron drift velocity}) \times \text{momentum relaxation time} > \text{channel length}. \quad [\text{Equation}]$$

8. A method of evaluating a performance of a plasma wave transistor (PWT), the method comprising:
   determining a physical condition used internally to a channel of a terahertz emitter in advance and inputting the physical condition to a performance parameter of a design window;
   generating visual emission phases, each corresponding to a plurality of substances for a PWT element, in response to a change in the performance parameter through a three-dimensional (3D) plot; and
   comparing the generated visual emission phases and displaying a comparison result on a display,
   wherein the design window sets a plasma wave velocity adjusted based on a gate overdrive voltage to be a first axis, sets an electron drift velocity adjusted based on a drain-to-source voltage to be a second axis, and sets a channel length to be a third axis, and
   wherein the design window represents whether the PWT operates as the terahertz emitter in response to a change in a performance parameter value of the PWT based on a relational expression of the first axis, the second axis, and the third axis.

9. The method of claim 8, wherein the design window determines a range of an electron drift velocity, a plasma wave velocity, and a channel length guaranteeing a function of the terahertz emitter by three-dimensionally expressing a change in an emission boundary based on a change in the channel length and a channel mobility simultaneously.

10. The method of claim 8, wherein, using a characteristic that a mobility of a plasma wave is classified into an upstream component and a downstream component and an emission of the terahertz emitter occurs in response to a multiple reflection, the design window is designed to include a physical condition satisfying the following equation:

$$(\text{Plasma wave velocity} - \text{electron drift velocity}) \times \text{momentum relaxation time} > \text{channel length}. \qquad [\text{Equation}]$$

\* \* \* \* \*